United States Patent
Baltzer et al.

(10) Patent No.: US 6,169,405 B1
(45) Date of Patent: Jan. 2, 2001

(54) FUNCTIONAL TEST PROCESS FOR A MECHANICAL SWITCHING ELEMENT

(75) Inventors: Martin Baltzer; Detlev Schuckar; Rocco Gonzalez, all of Berlin (DE)

(73) Assignee: Siemens AG, Munich (DE)

( * ) Notice: Under 35 U.S.C. 154(b), the term of this patent shall be extended for 0 days.

(21) Appl. No.: 09/000,287
(22) PCT Filed: Jul. 17, 1996
(86) PCT No.: PCT/DE96/01379
    § 371 Date: Apr. 13, 1998
    § 102(e) Date: Apr. 13, 1998
(87) PCT Pub. No.: WO97/05500
    PCT Pub. Date: Feb. 13, 1997

(30) Foreign Application Priority Data

Jul. 26, 1995 (DE) .............................................. 195 29 013

(51) Int. Cl.⁷ .................................................. G01R 31/02
(52) U.S. Cl. .......................... 324/424; 361/153; 324/423
(58) Field of Search ................................... 324/424, 423, 324/418; 340/635, 644, 661, 664; 361/153, 154, 159, 187

(56) References Cited

U.S. PATENT DOCUMENTS 4,366,743 * 1/1983 Leszczewski ........................ 91/363 R
4,620,156 * 10/1986 Alvin et al. ............................... 324/424
5,270,900 12/1993 Alden et al. ............................. 361/153

FOREIGN PATENT DOCUMENTS

| 1297526 | 3/1992 | (CA) . |
| 2 251 472 | 4/1974 | (DE) . |
| 23 52 493 | 4/1975 | (DE) . |
| 25 05 661 | 8/1975 | (DE) . |
| 34 19 752 | 11/1985 | (DE) . |
| 93 20 915 | 6/1995 | (DE) . |
| 3-13872 | 1/1991 | (JP) . |

OTHER PUBLICATIONS

"Condition Monitoring in High– and Medium Voltage Switchgear Assemblies", Jochen Kreusel et al., Elektrizitatswirtschaft [Electricity Management], vol. 94, issue 7 (No Month Available), 1995, pp. 350–358.

* cited by examiner

Primary Examiner—Safet Metjahic
Assistant Examiner—Vincent Q. Nguyen
(74) Attorney, Agent, or Firm—Kenyon & Kenyon

(57) ABSTRACT

In the functional test process for a mechanical switching element, particularly a trigger in a high-voltage power switch, a coil core (2) is set in motion by the magnetic action of a current flowing through a coil (1). The electrical pulse is cut off as soon as the derivative of the measured current characteristic reaches a particular valve. This makes it possible to stop the movement of the core (2) and the plunger (4) without triggering the power switch.

8 Claims, 4 Drawing Sheets

FUNCTIONAL TEST PROCESS FOR A MECHANICAL SWITCHING ELEMENT

FIELD OF THE INVENTION

The present invention relates to a functional test process for a mechanical switching element, particularly a mechanical switching element structured as a trigger in a high-voltage power switch, in which process a coil core is set in motion by the magnetic action of a current flowing through a coil, the coil having an electrical pulse applied to it, and the characteristic of the current through the coil being measured and differentiated by means of a monitoring device.

BACKGROUND INFORMATION

In a conventional functional test process for a mechanical switching element of an electrical switching system (*Elektrizitätswirtschaft,* Vol. 94 (1995), Issue 7), a functional test is performed in the rest state, i.e. a measurement pulse which is applied to a load circuit at predetermined time intervals is so short that no movement of the switching element is triggered. Only the conductivity of the load circuit is tested in this way. Therefore it is not possible to check the mechanical mobility of the switching element.

U.S. Pat. No. 5,270,900 describes an electromagnetic switching element which is formed from a coil with a core and which is used for opening and closing a valve. The movement of the core which leads to opening of the valve is triggered with an electrical pulse which is applied to the coil. The time during which the valve remains open is predetermined by a counter. In order to determine the time point for the counter to start, the current characteristic in the coil is measured and differentiated. After the derivative of the measured current has reached a previously determined value, the counter is started. After the counter runs down, the valve is closed again using the switching element.

SUMMARY OF THE INVENTION

The present invention provides a process and a system for the functional testing of a mechanical switching element, in which the mechanical functionality of the switching element is checked without completely performing a switching process of the switching element.

This task is accomplished, according to the present invention, in that the electrical pulse is cut off as soon as the derivative of the measured current characteristic reaches a particular value.

A significant advantage which is achieved with the invention is the possibility of flexibly checking the switching element using a limited movement of the core of the coil. Because of the movement of the core in the coil, the coil inductivity and the magnetic flow are changed. Therefore the time characteristic of the current in the coil is influenced by the movement.

By monitoring the time derivative of the current characteristic in the coil, cutting off the electrical pulse which is applied to the coil is directly dependent on the movement of the core.

The point in time used for cutting off the electrical pulse, which is determined by differentiation of the current characteristic through the coil, is only dependent on the movement of the core which has actually taken place. Thus a lesser movement of the core results in the electrical current being cut off sooner under certain operating conditions (e.g. elevated temperature). Therefore the actual path distance which the core has traveled until the electrical pulse is cut off is essentially independent of the external operating conditions. This is important in order to guarantee that the process according to the present invention can be used under different conditions, without any risk of mistakenly triggering a switching process in the high-voltage power switch in the course of the testing process.

Advantageously, it can be provided that the pulse level is less during the functional test than during an actual triggering process.

This can be achieved, for example, in that a pre-resistor precedes the coil in the circuit during the functional test.

In another advantageous development of the present invention, it can be provided that the electrical pulse is cut off as soon as the derivative of the measured current characteristic first changes its sign after the start of the electrical pulse.

The time at which the derivative of the measured current characteristic changes its sign is a point that can be particularly well determined by means of measurements. It is therefore especially suitable as a trigger time for cutting off the electrical pulse.

Advantageously, it can also be provided that a constant voltage source is used as the source for the electrical pulse.

A constant voltage source is an easily available apparatus for generating electrical voltage pulses.

It can also be advantageous that after the electrical pulse is cut off, a pulse-width-modulated sequence of additional pulses is generated in the coil, their current average over time causing a controlled movement of the coil core.

In this way, the plunger can be moved to the locking device, in controlled manner, without resulting in unlocking. The idle stroke of the trigger can then be measured.

As an advantageous development of the device for implementing the functional test process, it can be provided that the device has a pulse emitter for supplying an electrical pulse, a monitoring device for measuring and differentiating the current characteristic in the coil, a subsequent comparator, a device for adjusting the threshold value of the comparator, and a control device for cutting off the electrical pulse as soon as the derivative of the measured current characteristic has reached a particular value.

In this way, the structure of the control device is simple to establish, and does not need to be individually adapted to the conditions which prevail in functional testing of different variants of electromagnetic triggering devices in each instance.

DETAILED DESCRIPTION OF THE INVENTION

Figure 1:
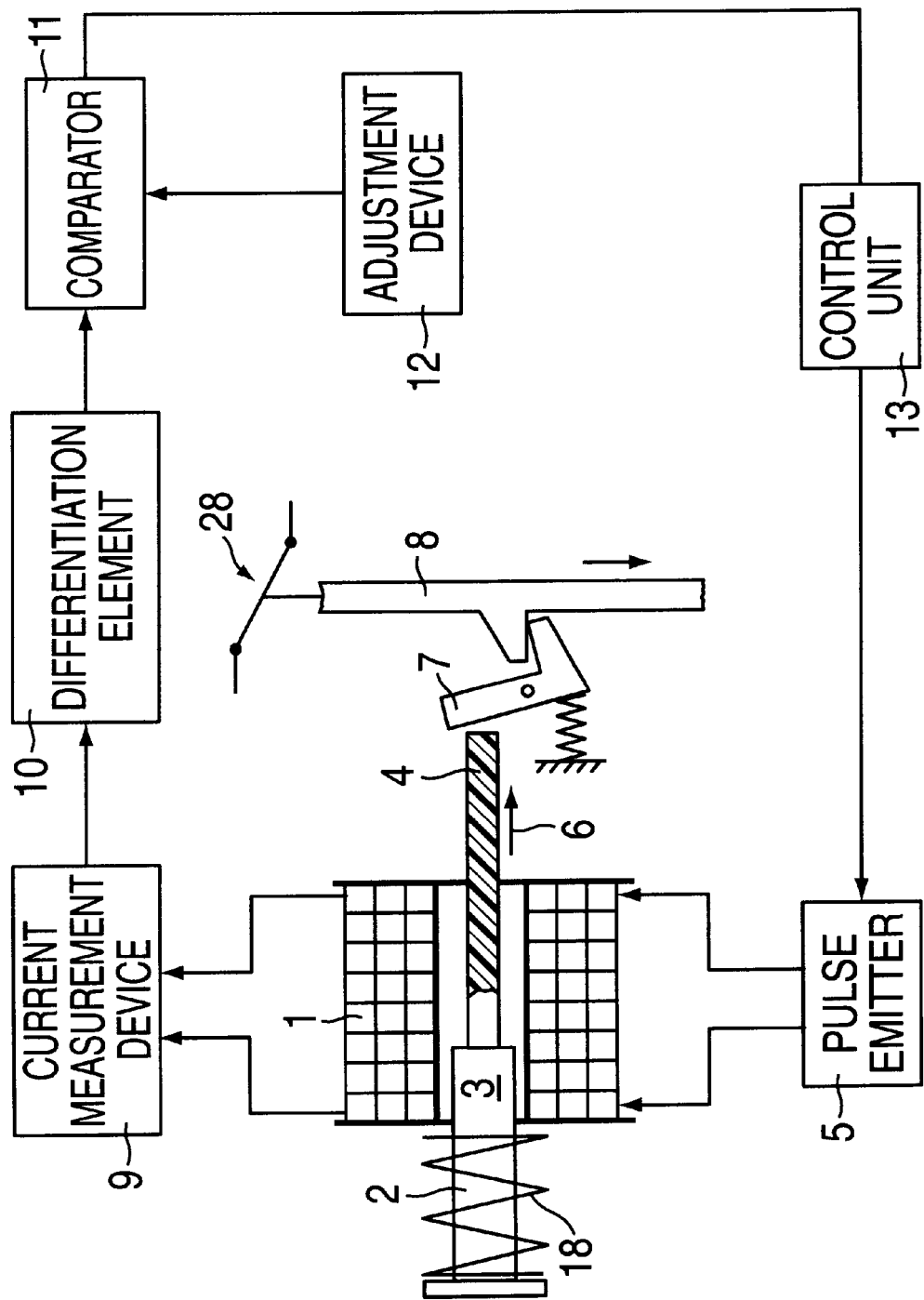
FIG. 1 shows a block diagram of a functional test process for a mechanical switching element according to the present invention.

In accordance with FIG. 1, an electromagnetic trigger is formed in a high-voltage power switch 28 using a ferromagnetic core 2 arranged in a coil 1. A plunger 4 made of a nonmagnetic material is affixed at the core's face 3. If an electrical pulse is applied to coil 1 by a pulse emitter 5, core 2 and plunger 4 move in the direction of arrow 6. During the functional test, the path traveled by core 2 and plunger 4 is to be limited, in order to prevent unlocking of elements 7, 8 of the high-voltage power switch. In order to achieve this, the current flowing in the coil while the electrical pulse is applied to it is measured using a current measurement device 9. The time derivative of the measured current characteristic is determined using a differentiation element 10. The characteristic of the time derivative of the current forms the first input variable of a comparator 11. A threshold value is applied to the reference input of comparator 11 using an adjustment device 12. If the first variable supplied to comparator 11 reaches the threshold value, the comparator sends a signal to a control unit 13, which in turn gives a signal to pulse emitter 5, in order to cause the electrical pulse to be cut off.

Figure 2A:
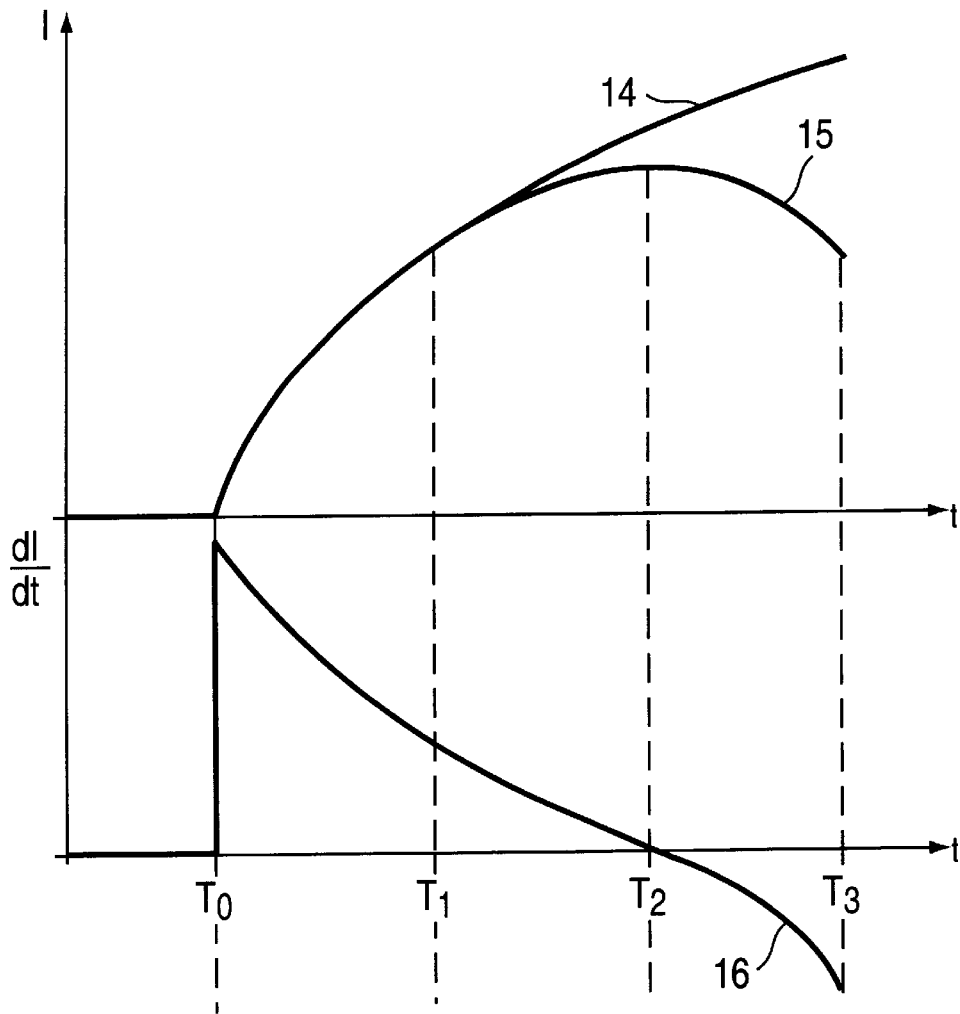
FIG. 2A shows a curve characteristic of the current in the coil and its time derivative.

If a real coil has an electrical pulse applied to it at time $T_0$, the current characteristic in coil 1 will demonstrate time characteristic 14 shown schematically in FIG. 2A. If a movable core 2 is arranged in coil 1, then the time characteristic of the current in the coil will be changed by the movement of core 2 triggered by the electrical pulse at time $T_1$, starting at time $T_1$, as compared to the characteristic without movement of the core. The changed time characteristic of the current is schematically shown in FIG. 2A, by a curve 15.

Figure 2B:
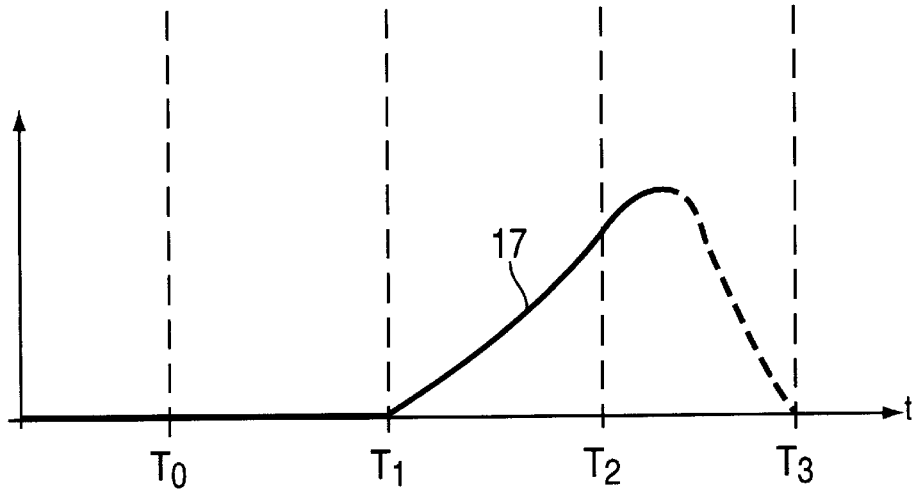
FIG. 2B shows a curve characteristic of the path traveled by the core.

In FIG. 2B, the stroke 17 traveled by core 2 is plotted over time. After the pulse is cut off at time $T_2$, core 2 still moves slightly further, and is then moved back by a recuperating spring 18.

At time $T_2$, curve 15 passes through a local maximum, in contrast to curve 14 without any movement of the core. The rise in curve 15 is zero at this point in time. Derivative 16 of curve 15 has a zero pause at time $T_2$. $T_2$ is therefore a point in curve 16 which can be particularly well determined using measurements. It is therefore advantageous to use it in order to determine the point in time for cutting off the electrical pulse which is applied to the coil. However, any desired point in time between $T_1$ and $T_2$ or after $T_2$, at which cut-off of the electrical pulse is to take place, can be indirectly established using adjustment device 12 of comparator 11. The time at which the pulse is cut off can always be selected so that elements 7, 8 of the high-voltage power switch are not unlocked by the movement of core 2 and plunger 4 in the direction of arrow 6.

The present invention described above can advantageously be used to measure the stroke of a mechanical switching element, particularly a trigger in a high-voltage power switch.

The trigger stroke is composed of idle stroke $H_L$ and working stroke $H_W$. If an electrical pulse is applied to trigger coil 1, core 2 and plunger 4 move without performing mechanical work, until they reach elements 7, 8 of the high-voltage power switch. The path traveled during this process is referred to as idle stroke $H_L$. From this point on, the core must perform mechanical work in order to unlock elements 7, 8. The path traveled until complete unlocking occurs is referred to as working stroke $H_W$.

To measure idle stroke $H_L$, a movement of plunger 4 until it makes contact with element 7 is necessary. When this happens, elements 7, 8 are not supposed to be unlocked. Plunger 4 and core 2 are supposed to remain in this position.

To measure working stroke $H_W$, plunger 4 and core 2 must completely unlock elements 7, 8 and remain in the unlocking position, i.e. the full triggering stroke must be traveled.

In accordance with the present invention described, the electrical pulse is cut off as soon as the derivative of the measured current characteristic reaches a particular value. This guarantees limited movement of core 2 and plunger 4. Because of the mechanical counter-force of recuperating spring 18, core 2 and plunger 4 are brought back into their starting position as soon as the electrical pulse is cut off.

Figure 3A:
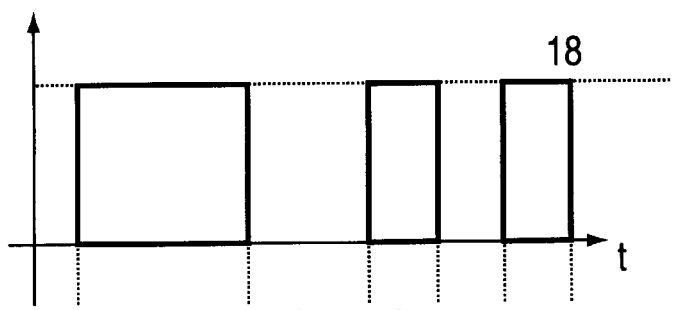
FIG. 3A shows a time characteristic of the electrical pulses supplied to the coil.
Figure 3B:
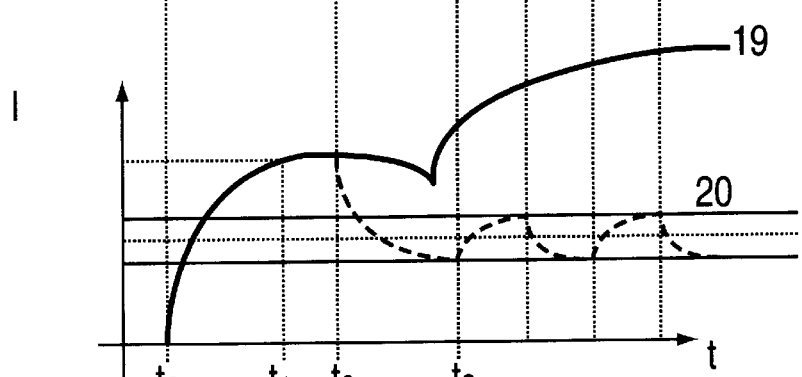
FIG. 3B shows a curve characteristic of the current in the coil.
Figure 3C:
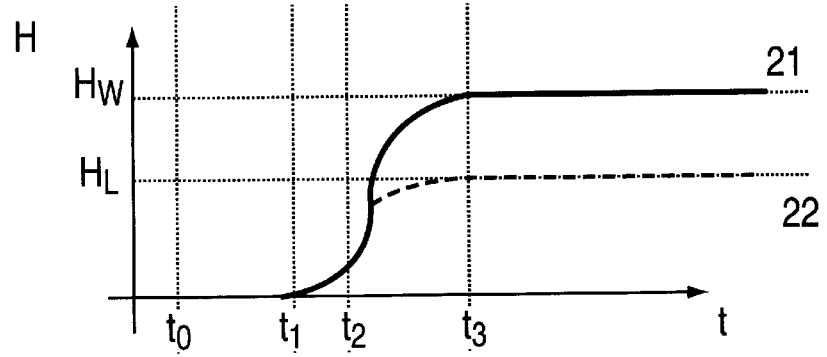
FIG. 3C shows a curve characteristic of the path traveled by the core.

If, as described above, the electrical pulse is cut off at time $T_2$, as shown in FIG. 2A (see FIG. 3B), the current characteristic drops exponentially after a brief movement (twitching) of the core. By supplying additional electrical pulses with a defined length (see FIG. 3A), a saw-tooth-shaped current characteristic can be adjusted within a tolerance range, the current average being greater than or equal to the required holding current at this position of the core. If the electrical pulse is cut off when the current characteristic exceeds a particular value, and is turned on again when the current characteristic goes below a particular value, this results in a saw-tooth-shaped current characteristic with a low amplitude. This type of regulator is referred to as a two-point regulator. The pick-up current, for example, i.e. the current value which starts movement of the coil core, can be selected as the guide variable of this regulator. This prevents the core from moving back (see FIG. 3C).

To regulate the current average, a current regulator which functions according to the PWM (pulse-width modulation) principle can be used, i.e. the width of the electrical pulses is changed as a function of the current difference between the reference value and the actual value of the current. If the current difference is positive, an electrical pulse which causes the current characteristic in the trigger branch to rise is generated. The width of the electrical pulse in the coil is proportional to the current difference. If the current difference is negative or equal to zero, no electrical pulse is generated. Again, the pick-up current can serve as the guide variable of this regulator.

The current regulator intervenes immediately after the functional test of the trigger. If the functional test is positive, i.e. if the core moves, the trigger stroke measurement is performed, otherwise the trigger stroke measurement is not performed.

Because of the broader air gap in the starting position of the core, the required pick-up current in this position is significantly greater than the required holding current in any other position of the core. If the pick-up current is used as the guide variable for the current regulator, the core will continue to move slowly forward. In order to move plunger 4 until it makes contact with element 7, the adjusted current value, i.e. the guide variable of the control circuit, must be selected to be so high that spring 18 is prevented from moving core 2 back. The current characteristic is not allowed to drop below precisely the current value which is necessary to hold the core in this position.

The goal of this process is to move plunger 4 until it touches element 7 and, at the same time, not to unlock elements 7, 8. While the plunger is held in this position, the idle stroke can be measured as the difference between the starting position and this position, using a length measurement device. In order to achieve this, the force which the trigger develops must be less than the counter-force of elements 7, 8.

In the starting position of the core, the pick-up current generates precisely the force required to compensate the counter-force of the recuperating spring, and to move the core slowly forward. However, in a different position of the core, the same pick-up current level will generate a higher force. If the counter-force applied by elements 7, 8 is greater than the force generated by the trigger, in the position in which the plunger and element 7 touch one another, the core and the plunger will remain in this position. If the counter-force applied by elements 7, 8 is less than the force generated by the trigger, elements 7, 8 will be unlocked and a new measurement process has to be started. This can be prevented in that a lower current value is selected as the guide variable of the current regulator. A lower current value means that a lesser force is generated by the trigger, but this force is not allowed to become less than the force required for holding the core.

Figure 3D:
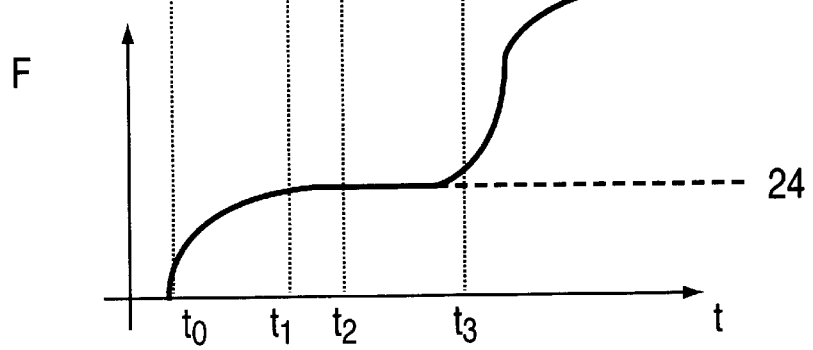
FIG. 3D shows a curve characteristic of the magnetic force.

The force which the trigger develops at a particular position of core 2 is proportional to the square of the current $F \sim i^2|_{x=const.}$. Therefore the force can be adjusted relatively easily, via the current, if the position of the core is known. After the pick-up process, the magnetic force increases due to the increase in magnetic flow and the decrease in the air gap (see FIG. 3D, curve 23), while the current value remains approximately the same. If the current value decreases, the magnetic force also decreases.

It can also be provided that a diode and an ohmic resistor are switched in series with one another and in parallel with the trigger coil, in order to adjust the exponential drop in the current.

The magnetic energy which is stored in the coil is converted to electrical energy each time the electrical pulse is cut off. This electrical energy is given off in the form of heat. If an ohmic resistor and a diode switched in the conducting direction for the cut-off process are switched in parallel with the trigger coil, the electrical energy is converted to heat via the resistor. By changing the resistor value, the time constant of the exponential current drop can now be adjusted. In this way, the time which is required until the guide variable, i.e. the predetermined current value in the regulator is reached can be adjusted.

Figure 4:
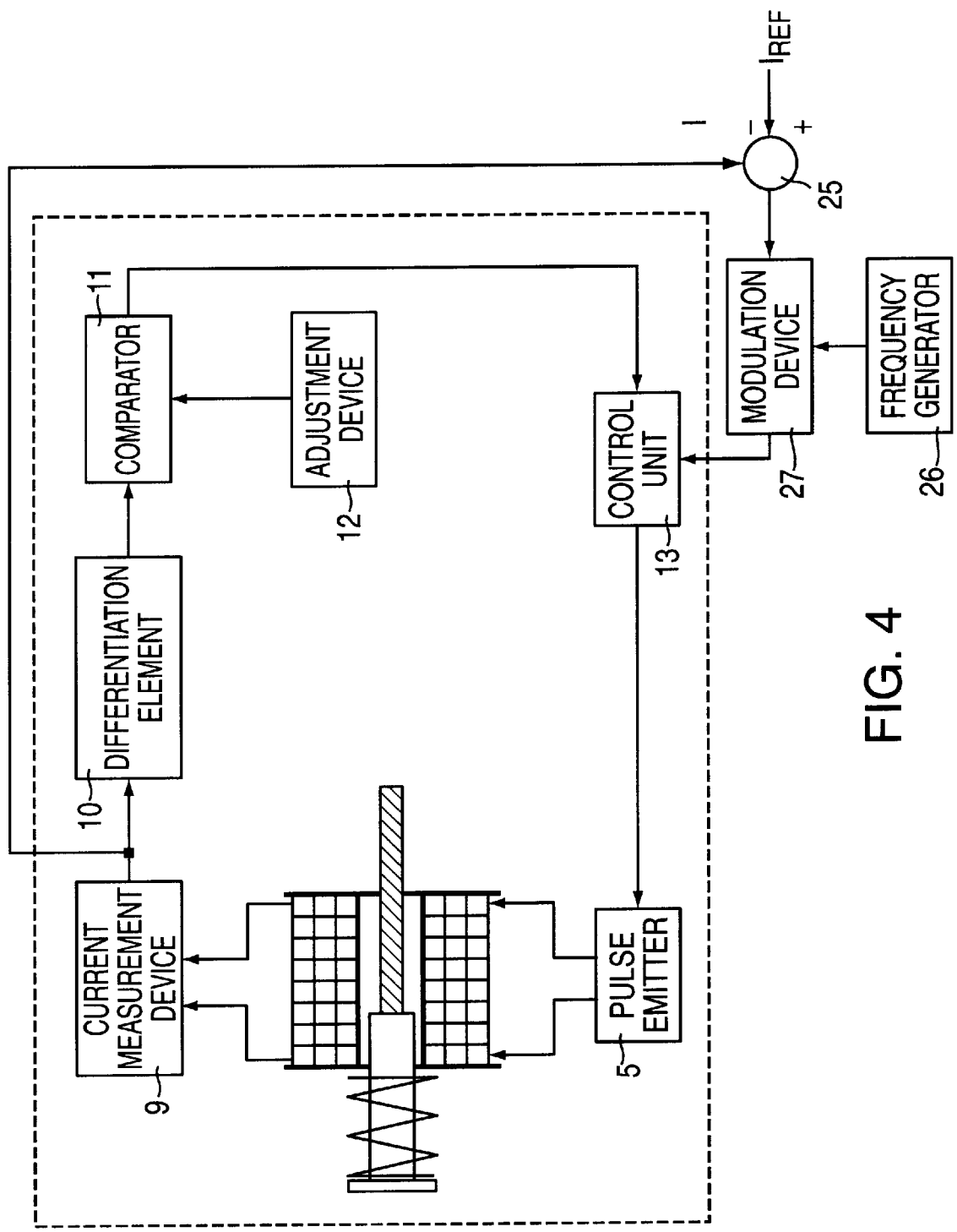
FIG. 4 shows a functional block diagram of a process for measuring the triggering stroke.

It can also be provided that a current regulator is used which is comprised of a comparator device 25, a frequency generator 26, and a modulation device 27 (see FIG. 4). Using comparator device 25, the difference between the adjusted reference current value and the actual current value at any time is determined. This difference is the first input variable for modulation device 27. The second input variable is the rectangular pulses which are generated by frequency generator 26. The width of the rectangular pulses is changed (modulated) on the basis of the current difference. These modulated pulses are applied, as a second input variable, to control unit 13, which in turn gives off a signal to pulse emitter 5.

Pulse width modulation (PWM) takes place, i.e. the width of the electrical pulses is changed as a function of the current difference between the reference value and the actual value of the current.

Once the idle stroke has been measured, the current can be increased by the coil to such a point that elements 7, 8 are unlocked and the plunger passes through the working stroke. The position before unlocking and after unlocking can be measured. The difference between these two positions represents the working stroke.

What is claimed is:

1. A functional test process for a mechanical switching element including a coil and a movable coil core, the process comprising the steps of:
    setting the coil core in motion by a magnetic action of a current flowing through the coil;
    applying a voltage to the coil to generate an electrical pulse;
    measuring a characteristic of the current through the coil using a monitoring device;
    differentiating the characteristic of the current through the coil using the monitoring device; and
    cutting off the voltage as soon as a derivative of the characteristic of the current reaches a predetermined value.

2. The process according to claim 1, wherein the mechanical switching element is a trigger in a high-voltage power switch.

3. The process according to claim 1, further comprising the step of:
    cutting off the voltage when a sign of the derivative of the characteristic of the current changes after a start of the electrical pulse.

4. The process according to claim 1, further comprising the step of:
    using a constant voltage source to generate the electrical pulse.

5. The process according to claim 1, further comprising the step of:
    generating a pulse-width-modulated sequence of additional pulses in the coil after the voltage is cut off, wherein a current average of the pulse-width-modulated sequence of additional pulses over time causes a controlled movement of the coil core.

6. The process according to claim 1, wherein the cutting off step includes cutting off the voltage as soon as a derivative of the characteristic of the current reaches a predetermined value so that an armature moves only minimally in the coil.

7. A functional test process for a mechanical switching element including a coil and a movable coil core, the process comprising:
    setting the coil core in motion by a magnetic action of a current flowing through the coil;
    applying a voltage to the coil to generate an electrical pulse, a level of the electrical pulse is less during the functional test process than during an actual triggering process;
    measuring a characteristic of the current through the coil using a monitoring device;
    differentiating the characteristic of the current through the coil using the monitoring device; and
    cutting off the voltage when a derivative of the characteristic of the current reaches a predetermined value.

8. A device for implementing a functional test process, the device comprising:
    a pulse emitter for supplying an electrical pulse;
    a monitoring device for measuring and differentiating a characteristic of a current in a coil;
    a comparator coupled to the monitoring device;
    an adjustment device for adjusting a threshold value of the comparator; and
    a control device for cutting off the electrical pulse, wherein the control device cuts off the electrical pulse as soon as a derivative of the characteristic of the current reaches a predetermined value, and wherein the control device includes a modulation device for pulse-width-modulated control of the coil.

* * * * *